United States Patent
Iizuka et al.

(10) Patent No.: US 10,510,642 B2
(45) Date of Patent: Dec. 17, 2019

(54) SEMICONDUCTOR DEVICE MODULE

(71) Applicant: Mitsubishi Electric Corporation, Tokyo (JP)

(72) Inventors: Arata Iizuka, Tokyo (JP); Korehide Okamoto, Fukuoka (JP); Natsuki Tsuji, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/091,154

(22) PCT Filed: Jun. 3, 2016

(86) PCT No.: PCT/JP2016/066538
§ 371 (c)(1),
(2) Date: Oct. 4, 2018

(87) PCT Pub. No.: WO2017/208430
PCT Pub. Date: Dec. 7, 2017

(65) Prior Publication Data
US 2019/0131213 A1    May 2, 2019

(51) Int. Cl.
*H01L 23/48* (2006.01)
*H01L 23/488* (2006.01)
*H01L 23/053* (2006.01)
*H01L 23/16* (2006.01)
*H01L 23/36* (2006.01)

(52) U.S. Cl.
CPC .......... *H01L 23/488* (2013.01); *H01L 23/053* (2013.01); *H01L 23/16* (2013.01); *H01L 23/36* (2013.01)

(58) Field of Classification Search
CPC ..... H01L 23/488; H01L 23/053; H01L 23/16; H01L 23/28; H01L 23/36; H01L 23/48; H01L 25/07; H01L 25/18

USPC ......................................... 257/691, 692, 706
See application file for complete search history.

(56) References Cited

U.S. PATENT DOCUMENTS 8,491,098 B2 * 7/2013 McAvoy .............. B41J 2/14427
347/54

FOREIGN PATENT DOCUMENTS

JP         2009-105267 A     5/2009

OTHER PUBLICATIONS

International Search Report issued in PCT/JP2016/066538; dated Jul. 26, 2016.

* cited by examiner

*Primary Examiner* — Tan N Tran
(74) *Attorney, Agent, or Firm* — Studebaker & Brackett PC

(57) ABSTRACT

The present invention relates to a semiconductor device module which includes: a semiconductor device including a top electrode and a bottom electrode; a substrate on which the bottom electrode of the semiconductor device is bonded; a heat sink on which the substrate is mounted; a lead electrode through which a main current of the semiconductor device flows; an insulating case disposed to enclose the substrate; and a retainer disposed in a cantilevered manner in the insulating case, the retainer supporting the lead electrode, wherein the lead electrode has one end brazed to the top electrode of the semiconductor device, and another end side inserted into a wall of the insulating case, and the retainer is engaged on the one end of the lead electrode to restrict movement of the lead electrode.

10 Claims, 8 Drawing Sheets

F I G. 6
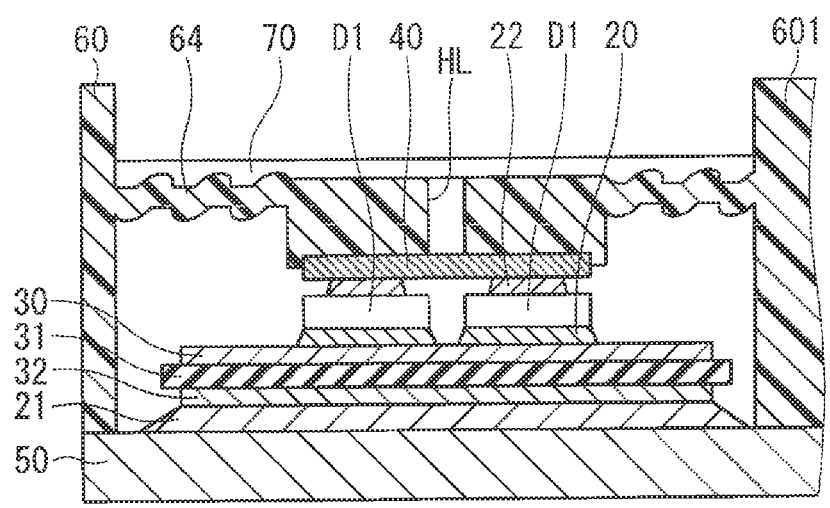

SEMICONDUCTOR DEVICE MODULE

TECHNICAL FIELD

The present invention relates to a semiconductor device module, and particularly to a semiconductor device module including a power device.

BACKGROUND ART

In recent years, high-power and downsized semiconductor device modules with high reliability have been sought as in-car power semiconductor devices. To realize these, a direct lead bonding (DLB) structure for directly bonding a power device to an external leading electrode has been introduced. Furthermore, a study has been conducted on a semiconductor device module having a direct cooling structure and combined with a finned heat sink.

When the direct cooling structure is used, a structure of packaging a plurality of power devices as one module is desired to facilitate seal design of a cooling unit and also connection to an external wire.

In the DLB structure, the reliability of the module is affected by the shape of a brazing filler metal for bonding a power device to a lead electrode, an amount of thermal displacement of the lead electrode, and the adhesion of a sealing material to each component. Thus, the shape of the brazing filler metal and the adhesion of the sealing material need to be kept in good condition to improve the reliability of the module.

Manufacturing the high-output semiconductor devices requires arranging a plurality of power devices in parallel while upsizing the individual power devices, which upsizes not only the lead electrodes but also the packages. Thus, the challenge to obtain a favorable shape of the brazing filler metal is to improve alignment precision of a lead electrode and a power device.

Since the upsized packages increase the cost of pressure sealing with a mold resin, etc., a sealing structure of inserting one side of a lead electrode into a resin case and filling the resin case with an epoxy-based resin or a silicon-based resin is frequently used as disclosed in, for example, Patent Document 1. Here, the lead electrode is cantilevered. Thus, the thermal displacement of the electrode will be presumably larger due to the heat generated in, for example, a power device. In addition, disuse of the pressure sealing makes it difficult to reduce the thermal displacement of the lead electrode, which may increase the stress to the power device and reduce the reliability of the semiconductor device module.

PRIOR ART DOCUMENTS

Patent Documents

Patent Document 1: Japanese Patent Application Laid-Open No. 2009-105267

SUMMARY

Problem to be Solved by the Invention

The present invention has been conceived to solve the problems, and the object is to provide a semiconductor device module with a DLB structure in which the alignment precision of a lead electrode and a power device is improved and thermal displacement of the lead electrode is reduced.

Means to Solve the Problem

The semiconductor device module according to the present invention includes: a semiconductor device including a top electrode and a bottom electrode; a substrate on which the bottom electrode of the semiconductor device is bonded; a heat sink on which the substrate is mounted; a lead electrode through which a main current of the semiconductor device flows; an insulating case disposed to enclose the substrate; and a retainer disposed in a cantilevered manner in the insulating case, the retainer supporting the lead electrode, wherein the lead electrode has one end brazed to the top electrode of the semiconductor device, and another end side inserted into a wall of the insulating case, and the retainer is engaged on the one end of the lead electrode to restrict movement of the lead electrode.

Effects of the Invention

In the semiconductor device module according to the present invention, the retainer restricts the movement of the lead electrode. Consequently, the positional precision of the lead electrode will be improved, and a clearance between the lead electrode and the semiconductor device can be appropriately maintained. Furthermore, a brazing filler metal for the lead electrode can be brazed with a favorable shape maintained, and thermal displacement of the brazing filler metal due to the heat generated when an electric current is applied to the semiconductor devices will be reduced, which can improve the reliability of the semiconductor device module.

BRIEF DESCRIPTION OF DRAWINGS

FIG. 6 is a cross-sectional view illustrating a structure of Modification 3 of Embodiment 1.

DESCRIPTION OF EMBODIMENT(S)

Embodiment 1

Figure 1:
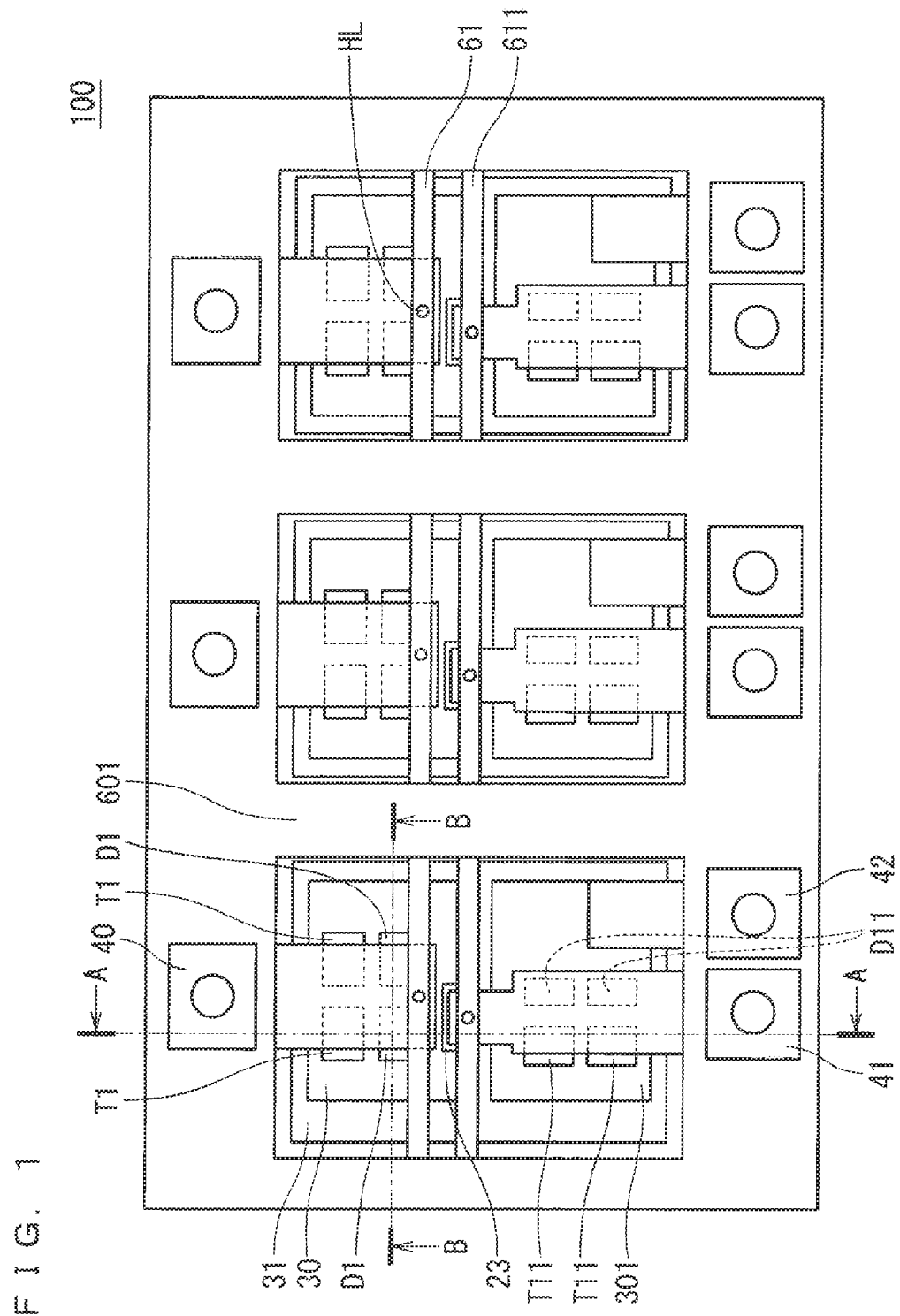
FIG. 1 is a plan view illustrating a configuration of a semiconductor device module 100 according to Embodiment 1.

FIG. 1 is a plan view illustrating a configuration of a semiconductor device module 100 according to Embodiment 1 of the present invention. The semiconductor device module illustrated in FIG. 1 is the one that packages, as one module, power devices such as an insulated gate bipolar transistor (IGBT), a metal-oxide-semiconductor field-effect transistor (MOSFET), and a free wheeling diode (FWD). FIG. 1 illustrates a three-phase inverter as one example.

In FIG. 1, for example, circuit patterns 30 and 301 are placed on an insulating substrate 31 made of, for example, aluminum nitride (AlN), inside a resin case 60 (insulating case). Switching devices T1 and diode devices D1 are mounted on the circuit pattern 30, and switching devices T11 and diode devices D11 are mounted on the circuit pattern 301. The switching devices T1 and the diode devices D1 are each two devices connected in parallel, and the switching devices T11 and the diode devices D11 are also each two devices connected in parallel. Each of the switching devices T1 and T11 and the diode devices D1 and D11 has top and bottom electrodes.

One end of a lead electrode 40 is bonded to the top electrodes of the switching devices T1 and the diode devices D1 with the direct lead bonding. One end of a lead electrode 41 is bonded to the top electrodes of the switching devices T11 and the diode devices D11 with the direct lead bonding.

The other end side of the lead electrode 40 opposite to the direct lead-bonded one end is embedded in a wall of the resin case 60 with insert molding. The other end is exposed on the top surface of the resin case 60 to be connected to an external wire.

The other end side of the lead electrode 41 opposite to the direct lead-bonded one end is embedded in the wall of the resin case 60 with insert molding. The other end is exposed on the top surface of the resin case 60 to be connected to an external wire. A lead electrode 42 is embedded in the wall of the resin case 60 with insert molding to be in parallel with the lead electrode 41. The other end is bonded on the circuit pattern 301 with the direct lead bonding. The main current of the inverter flows through the lead electrodes 40 to 42.

The described structure is of a single phase of the three-phase inverter. The remaining two phases with the same structure are placed inside the resin case 60.

The resin case 60 is partitioned by partitions 601 for each of accommodating regions of the phases of the inverter. In the regions partitioned by the partitions 601, retainers 61 and 611 for supporting one ends of the lead electrodes 40 and 41, respectively, are disposed in a cantilevered manner to cross from the wall of the resin case 60 to the partitions 601, and between the partitions 601.

Figure 2:
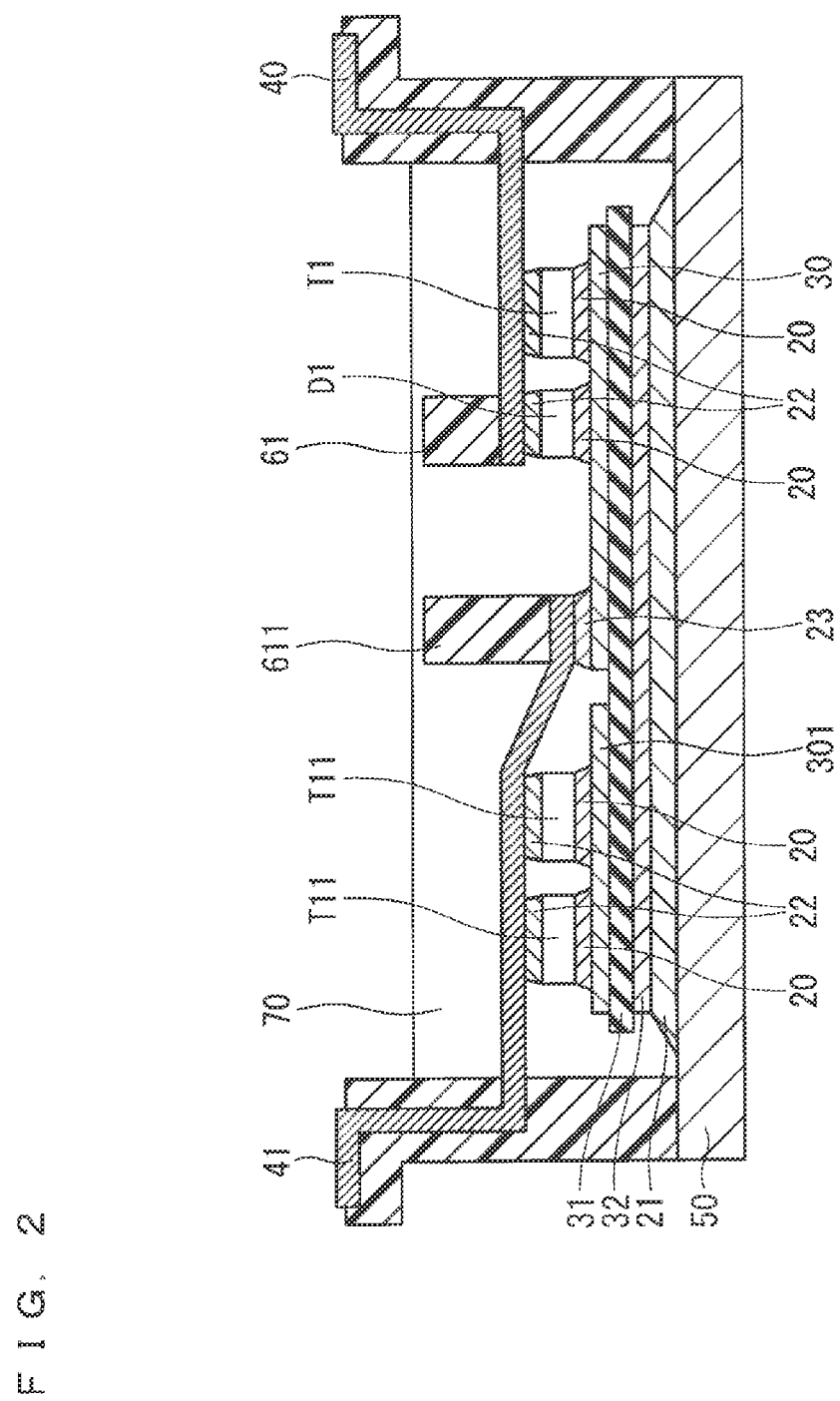
FIG. 2 is a cross-sectional view illustrating the structure of the semiconductor device module 100 according to Embodiment 1.
Figure 3:
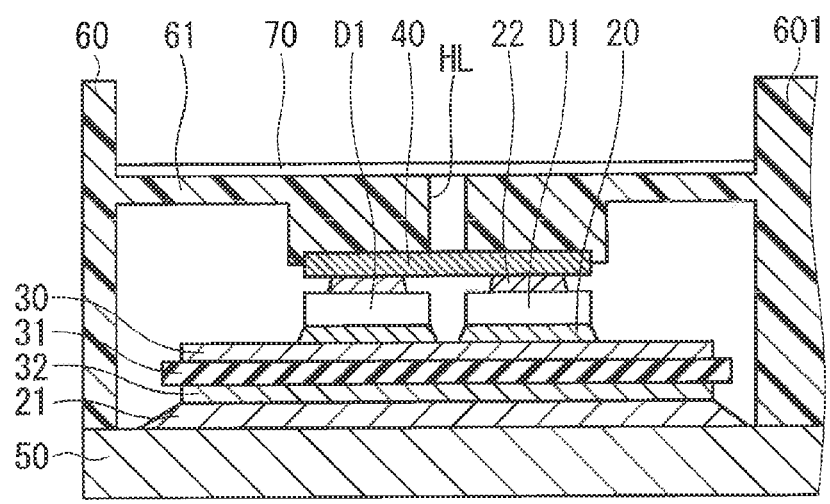
FIG. 3 is a cross-sectional view illustrating the structure of the semiconductor device module 100 according to Embodiment 1.

Next, the structure of the retainers 61 and 611 will be described with reference to FIGS. 2 and 3. FIG. 2 is a cross-sectional view illustrating a structure of the cross-section taken along a line A-A of FIG. 1 in the direction of arrows. FIG. 3 is a cross-sectional view illustrating a structure of the cross-section taken along a line B-B of FIG. 1 in the direction of arrows.

As illustrated in FIG. 2, the insulating substrate 31 is bonded, via a brazing filler metal 21 such as solder in the semiconductor device module 100, on a heat sink 50 made of a material with a higher thermal conductivity, for example, copper (Cu) or an alloy containing, as main elements, Al and Cu. The insulating substrate 31 is fixed by bonding a conductor pattern 32 placed on the rear surface side thereof to the brazing filler metal 21.

The circuit patterns 30 and 301 are placed on the front side of the insulating substrate 31. The bottom electrodes of the switching devices T1 and the diode devices D1 are bonded on the circuit pattern 30 via a brazing filler metal 20. The bottom electrodes of the switching devices T11 and the diode devices D11 (FIG. 1) are bonded on the circuit pattern 301 via the brazing filler metal 20. The circuit patterns 30 and 301 are conductors made of, for example, Al or Cu, and are formed by metalizing the surface of the insulating substrate 31.

The resin case 60 is mounted on the heat sink 50 to enclose the insulating substrate 31. The lead electrodes 40, 41, and 42 (FIG. 1) that are insert molded protrude from the inner surface of the resin case 60 to extend over the insulating substrate 31 in a cantilevered manner.

The lead electrode 41 with the other end side inserted into the wall of the resin case 60 has the one end side bonded to the top electrodes of the switching devices T11 and the diode devices D11 (FIG. 1) with the direct lead bonding via a brazing filler metal 22, and its tip bonded on the circuit pattern 30 via a brazing filler metal 23.

The tip of the lead electrode 41 is engaged with the retainer 611. Thus, the lead electrode 41 is bonded to the switching devices T11 and the diode devices D11 (FIG. 1) with its movement in the horizontal and vertical directions restricted.

The lead electrode 40 with the other end side inserted into the wall of the resin case 60 has the one end side bonded to the top electrodes of the switching devices T1 and the diode devices D1 with the direct lead bonding via the brazing filler metal 22.

The tip of the lead electrode 40 is engaged with the retainer 61. Thus, the lead electrode 40 is bonded to the switching devices T1 and the diode devices D1 with its movement in the horizontal and vertical directions restricted.

As illustrated in FIG. 3, the retainer 61 has a recess at a portion in contact with the lead electrode 40 to be in contact with not only the top surface but also the side surfaces of the lead electrode 40, thus allowing the movement of the lead electrode 40 in the horizontal direction to be restricted more reliably. The retainer 611 has the same structure.

The retainers 61 and 611 are formed integrally with the resin case 60 using the same resin. When the semiconductor device module 100 is assembled, the resin case 60 is disposed to cover the heat sink 50 on which the insulating substrate 31 and the various semiconductor devices are mounted. Consequently, the retainers 61 and 611 are in contact with the top electrodes of the various semiconductor devices (the switching devices T1 and T11 and the diode devices D1 and D11) via the brazing filler metal while supporting the tips of the lead electrodes 40 and 41.

The portions of the retainers 61 and 611 for supporting the lead electrodes 40 and 41, respectively, have through holes HL penetrating the retainers 61 and 611 in a thickness direction to allow verification of whether the lead electrodes 40 and 41 are supported. The through holes HL may be replaced with notches or slits formed by cutting out part of the retainers 61 and 611.

After the resin case 60 is disposed on the heat sink 50, the various semiconductor devices are bonded to the lead electrodes 40 and 41 and the lead electrode 41 is bonded to the circuit pattern 30 by melting the brazing filler metals. This process may be performed simultaneously or separately with a process of brazing the various semiconductor devices to the insulating substrate 31.

After the resin case 60 is disposed on the heat sink 50, the various semiconductor devices are bonded to the lead electrodes 40 and 41, and the lead electrode 41 is bonded to the circuit pattern 30. Then, filling the resin case 60 with a sealing material 70 made of silicone gel or an epoxy-based resin seals the structure on the heat sink 50 including the retainers 61 and 611.

As described above, the retainers 61 and 611 support the tips of the lead electrodes 40 and 41 that are disposed in a cantilevered manner, respectively. Consequently, the positional precision of the lead electrodes 40 and 41 will be improved, and the thermal displacement due to the heat generated when an electric current is applied to the semiconductor devices can be reduced. This can appropriately maintain clearances between the lead electrodes 40 and 41, the various semiconductor devices, and the circuit pattern 30, braze the brazing filler metals 22 and 23 with the favorable shapes maintained, and relieve the stress applied to the semiconductor devices and the brazing filler metals by reducing the thermal displacement due to the heat generated when an electric current is applied to the semiconductor devices. As a result, the reliability of the semiconductor device module will be improved.

Although FIGS. 2 and 3 illustrate the structure of bonding the heat sink 50 to the conductor pattern 32 via the brazing filler metal 21, the heat sink 50 may be bonded to the conductor pattern 32 through, for example, solid phase diffusion bonding or die casting bonding for bonding ceramic with a metal using a functionally graded material that changes its composition and structure depending on the position, without using a brazing filler metal. Alternatively, the brazing filler metal 21 may be directly bonded to the insulating substrate 31 without using the conductor pattern 32.

Although the rear surface of the heat sink 50 is flat, the heat sink 50 may be finned, such as pin finned or straight finned.

<Modification 1>

Although the retainers 61 and 611 are formed integrally with the resin case 60 using the same resin in the semiconductor device module 100 described above, the retainers 61 and 611 may be formed separately from the resin case 60.

Figure 4:
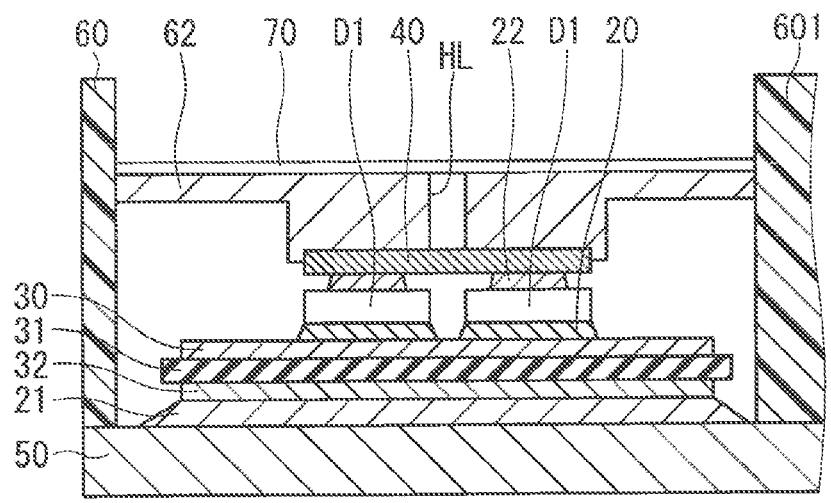
FIG. 4 is a cross-sectional view illustrating a structure of Modification 1 of Embodiment 1.

FIG. 4 is a cross-sectional view (corresponding to the cross-section taken along the line B-B of FIG. 1 in the direction of arrows) when a retainer 62 formed separately from the resin case 60 is used.

The retainer 62 is placed between the wall of the resin case 60 and the partition 601 to support the tip of the lead electrode 40. The retainer 62 may be fixed by, for example, fitting both ends thereof into dimples or slits formed on the wall of the resin case 60 and the partition 601.

The retainer 62 may be made of a material identical to or different from that of the resin case 60. The retainer 62 made of a material with higher heat resistance, for example, a metal or a resin with a heat resistance temperature higher than that of the resin case 60 will not be melted even when a brazing filler metal with a high melting point is used as the brazing filler metal 22 for bonding the semiconductor devices to the lead electrodes 40 and 41. Thus, an advantage of supporting the lead electrodes can be maintained.

Consequently, forming the retainer 62 separately from the resin case 60 can not only widen options for materials but also simplify the structure of the resin case 60 and reduce the manufacturing cost.

The retainer 62 may be attached to the resin case 60 by, for example, crimping or fastening screws.

<Modification 2>

Figure 5:
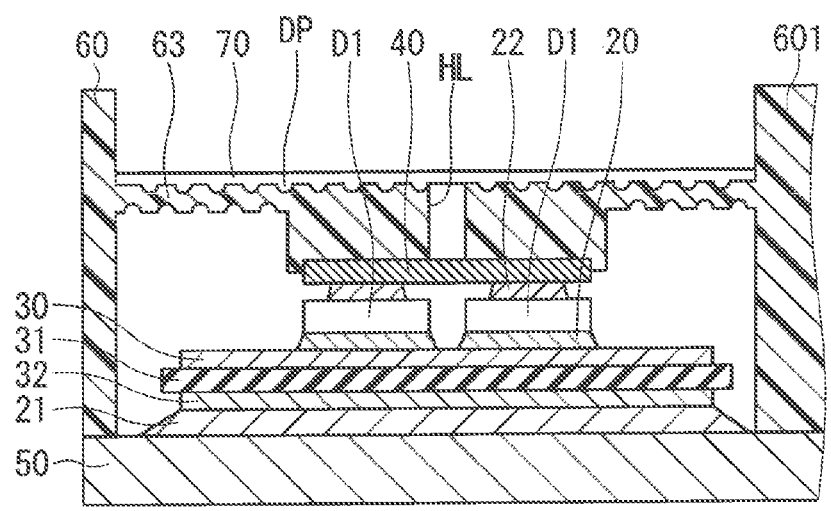
FIG. 5 is a cross-sectional view illustrating a structure of Modification 2 of Embodiment 1.

Although the structure of having the through holes HL at the portions of the retainers 61 and 611 for supporting the lead electrodes 40 and 41, respectively, in the semiconductor device module 100 is described above, the retainers may have a plurality of dimples DP on the surface as a retainer 63 illustrated in FIG. 5. The shape of the dimples is not limited to a circle but may be a rectangle.

FIG. 5 is a cross-sectional view (corresponding to the cross-section taken along the line B-B of FIG. 1 in the direction of arrows) when the retainer 63 formed integrally with the resin case 60 is used.

Adopting this structure can increase the surface area of the retainer 63 and improve the adhesion with the sealing material 70, and more strongly reduce the thermal displacement of the lead electrodes 40 and 41 due to the heat generated when an electric current is applied to the semiconductor devices. Thus, the stress applied to the semiconductor devices and the brazing filler metals can be further relieved, and the reliability of the semiconductor device module can be further improved.

<Modification 3>

Although the structure of having the through holes HL at the portions of the retainers 61 and 611 for supporting the lead electrodes 40 and 41, respectively, in the semiconductor device module 100 is described above, the retainers may have a waved surface with repeated protrusions and depressions as a retainer 64 illustrated in FIG. 6.

FIG. 6 is a cross-sectional view (corresponding to the cross-section taken along the line B-B of FIG. 1 in the direction of arrows) when the retainer 64 formed integrally with the resin case 60 is used.

Adopting this structure can increase the surface area of the retainer 64 and improve the adhesion with the sealing material 70, and more strongly reduce the thermal displacement of the lead electrodes 40 and 41 due to the heat generated when an electric current is applied to the semiconductor devices. Thus, the stress applied to the semiconductor devices and the brazing filler metals can be further relieved, and the reliability of the semiconductor device module can be further improved.

<Modification 4>

Figure 7:
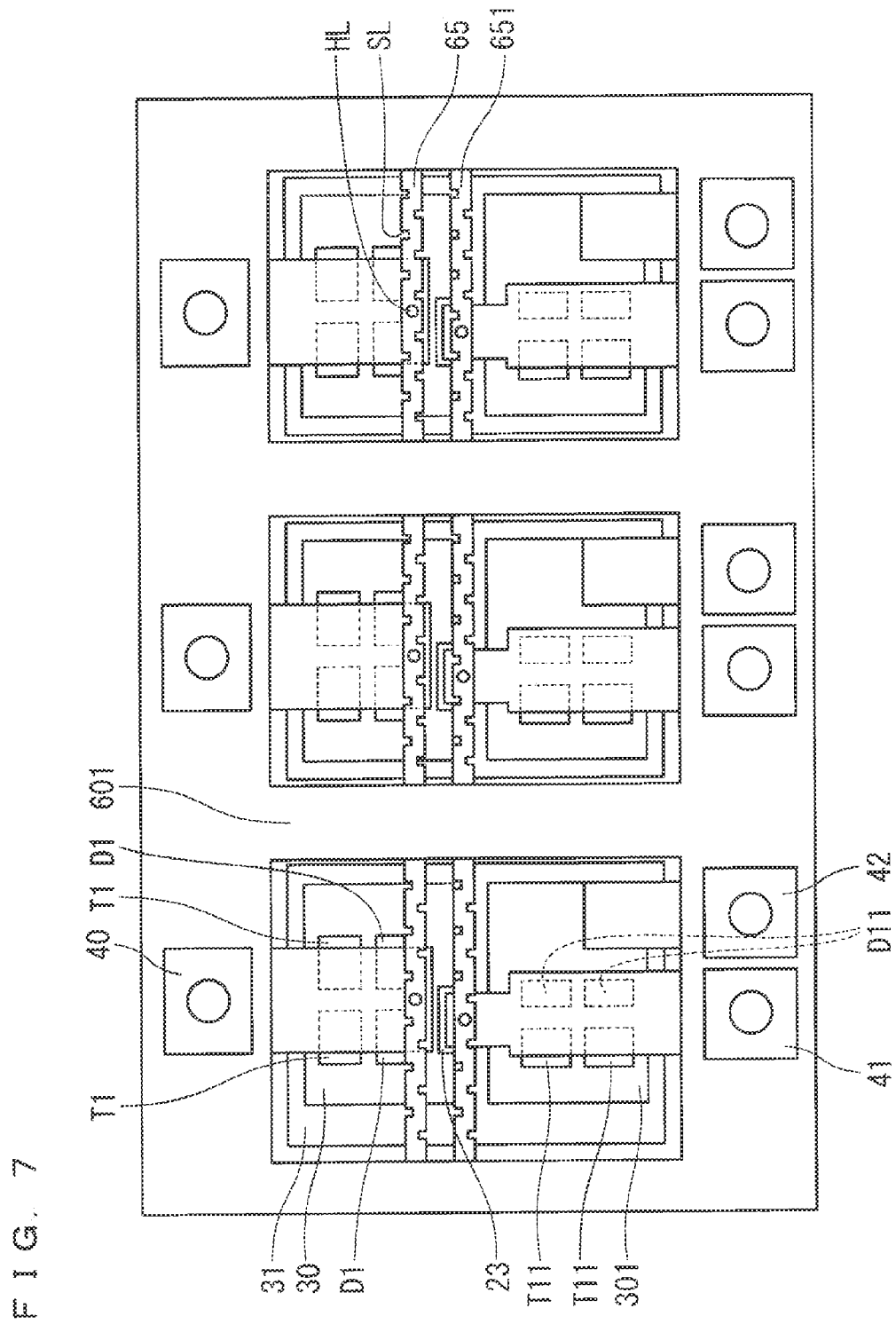
FIG. 7 is a plan view illustrating a configuration of Modification 4 of Embodiment 1.

Although the structure of having the through holes HL at the portions of the retainers 61 and 611 for supporting the lead electrodes 40 and 41, respectively, in the semiconductor device module 100 is described above, the entire retainers may include a plurality of slits SL as retainers 65 and 651 illustrated in FIG. 7. The plurality of slits SL are provided at intervals along long sides of the retainers 65 and 651 that are narrow rectangles in a plan view. The slits are approximately half the length of the short sides of the retainers 65 and 651. The slits SL, which are provided along the long sides of the retainers 65 and 651, are arranged in a staggered manner in each of the retainers so as not to be communicated with one another. As long as the slits SL prevent the retainers 65 and 651 from breaking, they are not limited to the ones with the arrangement and the lengths described. Alternatively, the slits SL may be replaced with notches.

Adopting this structure can increase the surface areas of the retainers 65 and 651 and improve the adhesion with the sealing material 70, and more strongly reduce the thermal displacement of the lead electrodes 40 and 41 due to the heat generated when an electric current is applied to the semiconductor devices. Thus, the stress applied to the semiconductor devices and the brazing filler metals can be further relieved, and the reliability of the semiconductor device module can be further improved.

Since the visibility immediately below the retainers will be improved with the plurality of slits SL provided, positioning the lead electrodes and the semiconductor devices will be eased when the resin case 60 is placed on the heat sink 50. Thus, improvement in the productivity can be expected.

The slits can be processed more easily than the waved retainer 64 illustrated in FIG. 6. Thus, increase in the manufacturing cost can be suppressed.

<Modification 5>

Figure 8:
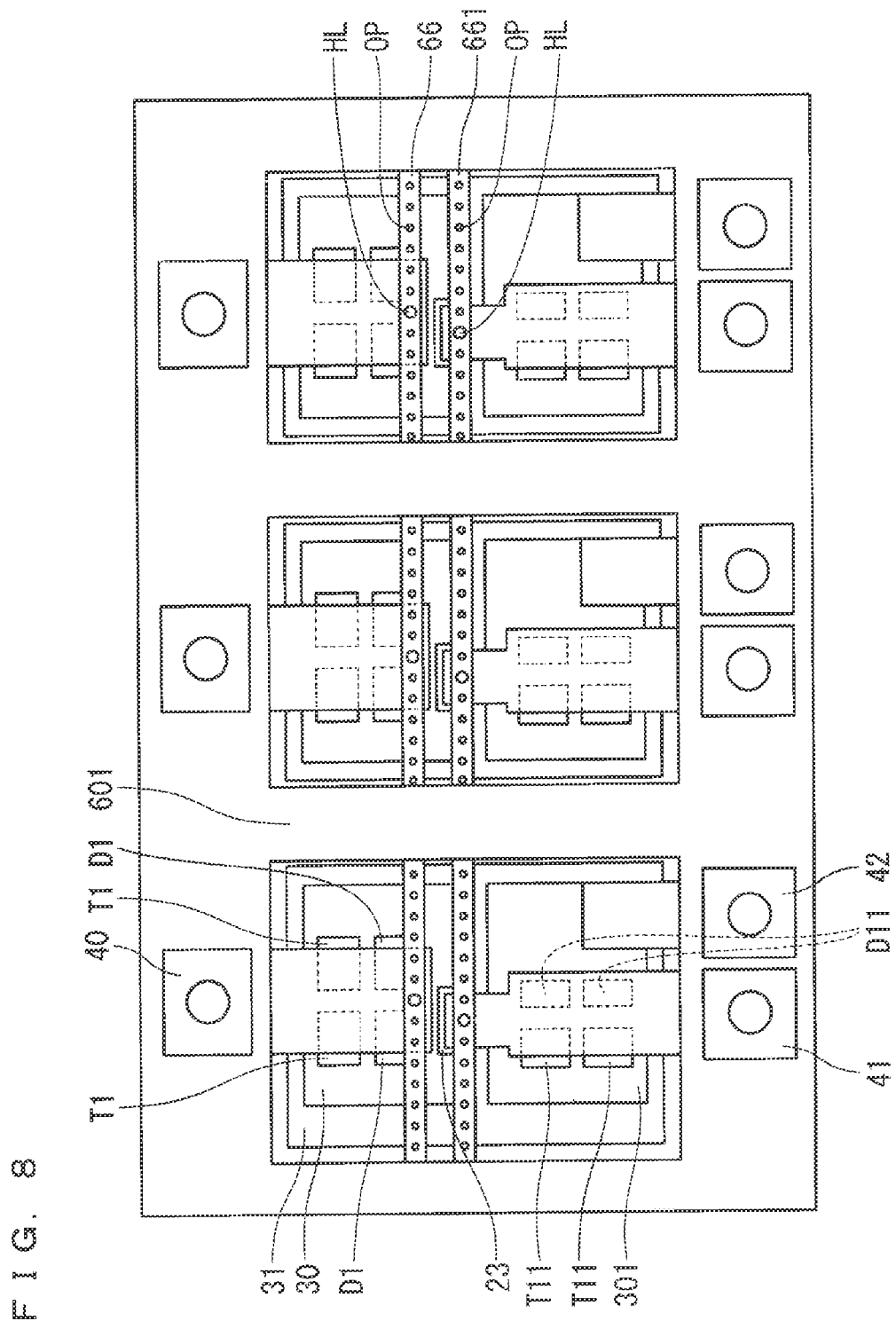
FIG. 8 is a plan view illustrating a configuration of Modification 5 of Embodiment 1.

Although the structure of having the through holes HL at the portions of the retainers 61 and 611 for supporting the lead electrodes 40 and 41, respectively, in the semiconductor device module 100 is described above, the entire retainers may include a plurality of openings OP as retainers 66 and 661 illustrated in FIG. 8. The plurality of openings OP are provided at intervals in the middle of the retainers 65 and 651 along a longitudinal direction. Although the openings OP are circular in a plan view in FIG. 8, they may be rectangular, oval, or elliptical.

Adopting this structure can increase the surface areas of the retainers 66 and 661 and improve the adhesion with the sealing material 70, and more strongly reduce the thermal displacement of the lead electrodes 40 and 41 due to the heat generated when an electric current is applied to the semiconductor devices. Thus, the stress applied to the semiconductor devices and the brazing filler metals can be further relieved, and the reliability of the semiconductor device module can be further improved.

Since the visibility immediately below the retainers will be improved with the plurality of openings OP provided, positioning the lead electrodes and the semiconductor devices will be eased when the resin case 60 is placed on the heat sink 50. Thus, improvement in the productivity can be expected.

The openings can be processed more easily than the waved retainer 64 illustrated in FIG. 6. Thus, increase in the manufacturing cost can be suppressed.

Although the retainers are formed integrally with the resin case 60 in Modifications 2 to 5 described above, they may be formed separately from the resin case 60, and fixed to the resin case 60 by, for example, fitting, crimping, or fastening screws. In such a case, the structure of the resin case 60 can be simplified, and the manufacturing cost can be reduced.

When the retainers are formed integrally with the resin case 60, the number of the components can be reduced, and operations for attaching the retainers are eliminated. Thus, the manufacturing processes can be simplified.

Embodiment 2

Figure 9:
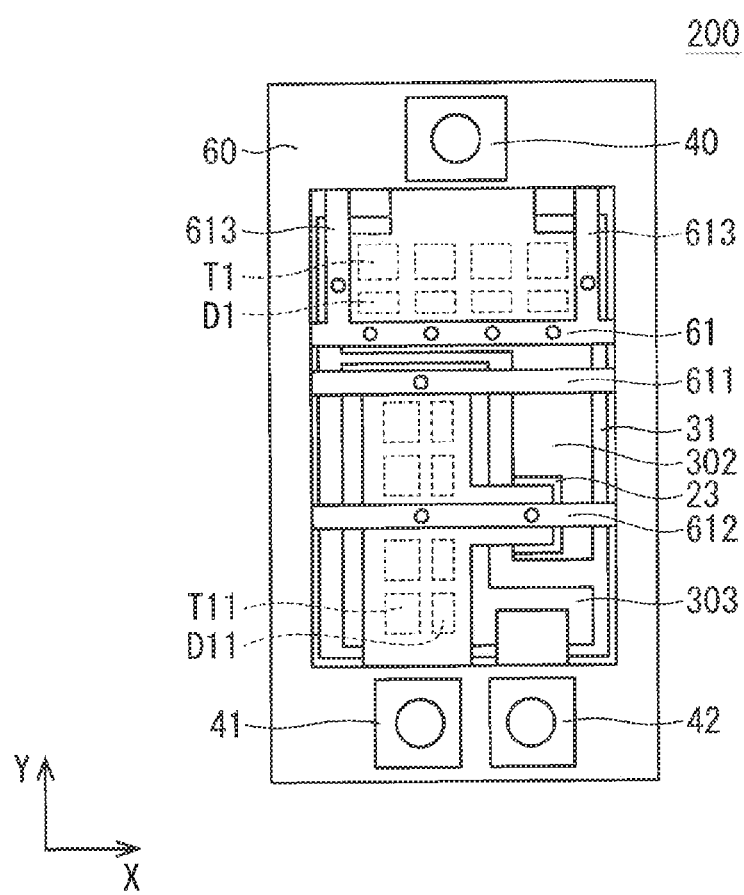
FIG. 9 is a plan view illustrating a configuration of a semiconductor device module 200 according to Embodiment 2.

FIG. 9 is a plan view illustrating a configuration of a semiconductor device module 200 according to Embodiment 2 of the present invention. Although the semiconductor device module illustrated in FIG. 9 is the one that packages, as one module, power devices such as an IGBT, a MOSFET, and a FWD, similarly as the semiconductor device module illustrated in FIG. 1, FIG. 9 illustrates a single-phase inverter. In FIG. 9, the same reference numerals are attached for the same structure as that of the semiconductor device module 100 described with reference to FIG. 1, and the overlapping description will be omitted.

In these days when the high-output semiconductor device modules have been sought, the number of semiconductor devices connected in parallel tends to increase, which upsizes the modules even with inclusion of the single-phase inverters.

In FIG. 9, circuit patterns 302 and 303 are placed on the insulating substrate 31. The switching devices T1 and the diode devices D1 are mounted on the circuit pattern 302, and the switching devices T11 and the diode devices D11 are mounted on the circuit pattern 303. The switching devices T1 and the diode devices D1 are each four devices connected in parallel, and the switching devices T11 and the diode devices D11 are also each four devices connected in parallel.

Increase in the number of the semiconductor devices connected in parallel widens the areas of the circuit patterns 302 and 303, and increases aspect ratios of one ends of the lead electrodes 40 and 41. In other words, the lead electrode 40 has one end shaped longer in a transverse direction (X direction) to cover the top of the four switching devices T1 arranged in the transverse direction and the four diode devices D1 arranged in parallel with the four switching devices T1, thus having a higher aspect ratio of the length in the transverse direction to the length in the longitudinal direction.

The lead electrode 41 has one end shaped longer in a longitudinal direction (Y direction) to cover the top of the four switching devices T11 arranged in the longitudinal direction and the four diode devices D11 arranged in parallel with the four switching devices T11, thus having a higher aspect ratio of the length in the longitudinal direction to the length in the transverse direction. A protruding portion extending in the transverse direction from the center portion of the one end of the lead electrode 41 that is shaped longer in the longitudinal direction is bonded on the circuit pattern 302 via the brazing filler metal 23.

When the aspect ratios of the one ends of the lead electrodes 40 and 41 increase, merely fixing the tips thereof by the retainers may cause distortion somewhere due to the thermal displacement. Thus, the lead electrode 40 having the one end shaped longer in the transverse direction includes the retainer 61 for supporting the tip of the one end, and two retainers 613 for supporting both end portions of the one end in the transverse direction.

The two retainers 613 are placed across between the retainer 61 and the wall of the resin case 60 to be orthogonal to the retainer 61.

Adopting such a structure can reduce the distortion due to the thermal displacement at both end portions of the one end of the lead electrode 40 in the transverse direction.

Furthermore, the lead electrode 41 having the one end shaped longer in the longitudinal direction includes the retainer 611 for supporting the tip of the one end, and a retainer 612 for supporting the center portion of the one end in the longitudinal direction.

The retainer 612 is placed across between the wall of the resin case 60 and the partition 601 to be parallel to the retainer 611.

Adopting such a structure can reduce the distortion due to the thermal displacement at the center portion of the one end of the lead electrode 41 in the longitudinal direction.

The retainers 613 and the retainer 612 may be referred to as auxiliary retainers because they assist the functions of the retainer 61 and the retainer 611, respectively.

Obviously, the retainers 612 and 613 may have the same structures as those in Modifications 1 to 5 of Embodiment 1.

<Example Structure of Power Device>

The aforementioned power devices such as an IGBT, a MOSFET, and a FWD included in the semiconductor device modules according to Embodiments 1 and 2 are not limited to silicon devices including silicon (Si) semiconductors but may be semiconductor devices having a bandgap wider than those of the silicon devices, such as silicon carbide (SiC), gallium nitride (GaN), and diamond (C). Compared to the silicon devices, application of these semiconductor devices can yield devices superior in withstand voltage, having higher allowable current density, superior in higher heat resistance, and capable of operations at high temperatures.

Thus, the power devices are more subject to high temperature, and the thermal displacement easily occurs in the lead electrodes. However, the thermal displacement can be reduced with application of the present invention.

Although the present invention is described in detail, the foregoing description is in all aspects illustrative and does not restrict the invention. Therefore, numerous modifications that have yet been exemplified will be devised without departing from the scope of this invention.

Embodiments of the present invention can be freely combined, and appropriately modified or omitted within the scope of the present invention.

The invention claimed is:

1. A semiconductor device module, comprising:
   a semiconductor device including a top electrode and a bottom electrode;
   a substrate on which the bottom electrode of the semiconductor device is bonded;
   a heat sink on which the substrate is mounted;
   a lead electrode through which a main current of the semiconductor device flows;
   an insulating case disposed to enclose the substrate; and
   a retainer disposed in a cantilevered manner in the insulating case, the retainer supporting the lead electrode,
   wherein the lead electrode has one end brazed to the top electrode of the semiconductor device, and another end side inserted into a wall of the insulating case, and
   the retainer is engaged on the one end of the lead electrode to restrict movement of the lead electrode.

2. The semiconductor device module according to claim 1,
   wherein the insulating case is filled with a sealing material, and
   the retainer includes a plurality of dimples on a surface of the retainer.

3. The semiconductor device module according to claim 1,
   wherein the insulating case is filled with a sealing material, and
   the retainer has a waved surface with repeated protrusions and depressions.

4. The semiconductor device module according to claim 1,
   wherein the insulating case is filled with a sealing material, and
   the retainer includes a plurality of slits on a surface of the retainer.

5. The semiconductor device module according to claim 1,
   wherein the insulating case is filled with a sealing material, and
   the retainer includes a plurality of openings penetrating the retainer in a thickness direction.

6. The semiconductor device module according to claim 1,
   wherein the retainer is engaged with a top surface and a side surface of the one end of the lead electrode.

7. The semiconductor device module according to claim 1,
   wherein the retainer is formed integrally with the insulating case.

8. The semiconductor device module according to claim 1,
   wherein the retainer is formed separately from the insulating case.

9. The semiconductor device module according to claim 8,
   wherein the retainer is made of a material different from a material of the insulating case.

10. The semiconductor device module according to claim 1, further comprising
    an auxiliary retainer disposed in a cantilevered manner in the insulating case, the auxiliary retainer assisting a function of the retainer,
    the auxiliary retainer being disposed parallel or orthogonal to the retainer, and
    the auxiliary retainer being engaged with a portion of the one end of the lead electrode, the portion being not engaged with the retainer.

* * * * *